United States Patent
Margalit et al.

(10) Patent No.: US 7,149,381 B2
(45) Date of Patent: Dec. 12, 2006

(54) OPTICAL FILTERING DEVICE AND METHOD

(75) Inventors: Moti Margalit, Zichron Yaakov (IL); Michael Yasin, Haifa (IL); Meir Orenstein, Haifa (IL)

(73) Assignee: Lambda Crossing, Ltd., Tel Aviv (IL)

(*) Notice: Subject to any disclaimer, the term of this patent is extended or adjusted under 35 U.S.C. 154(b) by 0 days.

(21) Appl. No.: 10/531,183

(22) PCT Filed: Oct. 9, 2003

(86) PCT No.: PCT/IL03/00813

§ 371 (c)(1),
(2), (4) Date: Oct. 29, 2005

(87) PCT Pub. No.: WO2004/034528

PCT Pub. Date: Apr. 22, 2004

(65) Prior Publication Data

US 2006/0127007 A1    Jun. 15, 2006

(30) Foreign Application Priority Data

Oct. 9, 2002    (IL) .................................. 152195

(51) Int. Cl.
G02B 6/28    (2006.01)
G02B 6/42    (2006.01)
H01S 3/08    (2006.01)

(52) U.S. Cl. .................... 385/24; 385/39; 385/50; 372/92

(58) Field of Classification Search .............. None
See application file for complete search history.

(56) References Cited

U.S. PATENT DOCUMENTS

| | | | |
|---|---|---|---|
| 4,852,117 A * | 7/1989 | Po ................... | 372/97 |
| 5,420,684 A | 5/1995 | Carroll | |
| 6,289,151 B1 * | 9/2001 | Kazarinov et al. ........... | 385/32 |
| 6,671,426 B1 * | 12/2003 | Litvin ................. | 385/15 |
| 2002/0037023 A1 | 3/2002 | Margalit et al. | |
| 2002/0085595 A1 | 7/2002 | Ksendzov et al. | |
| 2004/0114658 A1 | 6/2004 | Stegmuller | |

FOREIGN PATENT DOCUMENTS

| | | |
|---|---|---|
| WO | WO 00/24095 | 4/2000 |
| WO | WO 00/49689 | 8/2000 |
| WO | WO 00/76039 | 12/2000 |
| WO | WO 02/31933 A2 | 10/2001 |
| WO | WO 03/071641 A2 | 8/2003 |

* cited by examiner

OTHER PUBLICATIONS

Little, B. E. et al; "Microring Resonator Channel Dropping Filters"; Journal of Lightwave Technology, vol. 15, No. 6 Jun. 1997; pp. 998-1005; IEEE N.Y.

Primary Examiner—Ellen E. Kim
Assistant Examiner—Omar Rojas
(74) Attorney, Agent, or Firm—Simon Kahn

(57) ABSTRACT

A wavelength selective filter device is presented suitable for use as a part of a laser cavity for processing light output of a gain section of the laser cavity. The filter structure comprises a resonator structure including at least one closed-loop resonator; and defines an optical coupler structure for coupling light from an input/output of the gain section to propagate through said resonator structure, and a light reflector structure for reflecting light filtered by said resonator structure to propagate through said resonator structure to said input/output of the gain section. The filter structure is configured so as to define two optical paths of substantially the same lengths for light propagation in the resonator structure from and to the coupler structure.

15 Claims, 3 Drawing Sheets

OPTICAL FILTERING DEVICE AND METHOD

CROSS-REFERENCE TO RELATED APPLICATIONS

This application is a national stage application of International Patent Application PCT/IL2003/000813 filed Oct. 9, 2003 entitled "Optical Filtering Device and Method" which claims priority from Israel Patent Application S/N 152195 filed Oct. 9, 2002, the contents of both of which are incorporated herein by reference.

FIELD OF THE INVENTION

This invention is generally in the field of optical devices, and relates to a tunable filter structure based on waveguides and micro-resonators, and a laser device utilizing the same.

BACKGROUND OF THE INVENTION

The demand for increased bandwidth in fiberoptic telecommunications has driven the development of semiconductor transmitter lasers usable for propagation multiple data streams concurrently in a single optical fiber. In addition to telecommunication applications, semiconductor lasers are now commonly used within audio, visual and personal computer systems where they are employed in the read and, where applicable, write heads of CD, CDROM and DVD units.

Usually, semiconductor lasers operate with a wavelength spectrum consisting of a group of several closely spaced wavelengths. However, many applications require the single wavelength operation, narrow linewidth characteristics. This can be achieved by using a wavelength selective filter. One example of a commonly used wavelength selective filter is an etched grating incorporated within a structure to form Distributed Bragg Reflector (DBR) and Distributed Feedback (DFB) laser. However, statistical variation associated with the manufacture of an individual DBR and DFB laser results in distribution of the center of the fixed wavelength. To solve this problem, the DBR and DFB lasers are augmented by external reference etalons and usually require feedback control loops.

Conventional single frequency lasers may also be made to be tunable over wavelength ranges from one nanometer to several tens of nanometers. In optical networks, tunable lasers offer many compelling advantages over fixed wavelength devices. This is due to the fact that tunable lasers simplify planning, reduce inventories, allow dynamic wavelength provisioning, and simplify network control software, making the tunable lasers suitable for use in wavelength-agile applications, for example for wavelength sparing in wavelength division multiplex (WDM) systems.

A tunable laser can be realized as monolithic or hybrid integration. In the monolithic integration, all the components are implemented in a semiconductor substrate. In the hybrid integration, a laser cavity is implemented in a semiconductor chip, while spectrally sensitive elements (external wavelength selective filters) are implemented in a different optical medium.

A typical tunable laser is composed of an optical cavity that encompasses a gain section, and a tunable wavelength selective filter. The gain section includes a medium which can, for example, be a semiconductor based structure utilizing an active semiconductor material, e.g. a composition which is selected from InP, InGaAsP, GaAs, InGaAs, AlGaAs, InAlGaAs. In turn, the tunable wavelength selective filter can be realized as a micro-resonator, waveguide grating, fiber grating or bulk grating. These features are described, for example, in the following publications: B. Pezeshki, "*Optics & Photonics News*," May 2001, p. 34–38; WO 00/24095; WO 00/49689; WO 00/76039; and WO 02/31933. In particular, when a laser utilizes a wavelength selective filter in the form of a grating, the laser tuning can be performed by the modification of the grating, for example, by applying an external field (such as heat, stress, etc.) or by means of free careers injection (electron plasma).

Micro-ring resonators can provide high quality tunable wavelength selective filters. A laser constructed in a ring structure is disclosed in WO02/21650, assigned to the assignee of the present application. Such a laser is unidirectional in its operation. This is associated with the unidirectional nature of a ring resonator: light coupled into the ring at a coupling region propagates in the ring only in one direction. The use of ring resonators in a laser thus presents a problem in designing the laser cavity.

Light coupling into a ring resonator to provide light circulation in opposite directions around the ring has been proposed (e.g., U.S. Pat. No. 5,420,684) for creating a resonant interferometer. According to this technique, a passive resonator gyroscope is provided, in which light from a coherent or broadband source is injected into a waveguide beam splitter is coupled to a fiber optic ring. Frequency modulated light of substantially equal intensity circulates in opposite directions around the ring, and the returning light beams are recombined into the original waveguide with a portion of the recombined light provided to a photodetector. Due to the rotation of the ring, a Sagnac frequency shift is produced.

SUMMARY OF THE INVENTION

There is a need in the art for, and it would be useful to have, a novel tunable laser device enabling effectively suppressing transmission peaks at wavelengths other than a selected wavelength.

The present invention satisfies the aforementioned need by providing a novel laser cavity based on hybrid integration between a semiconductor gain medium and a tunable filter structure based on waveguides and one or more micro-resonators (closed-loop resonator).

According to one aspect of the present invention, there is provided a wavelength selective filter device which comprises a resonator structure including at least one closed-loop resonator; and defines an optical coupler structure for coupling light from an input/output of a gain section to propagate through said resonator structure, and a light reflector structure for reflecting light filtered by said resonator structure to propagate through said resonator structure to said input/output of the gain section, the filter structure being configured so as to define two optical paths of substantially the same lengths for light propagation in the resonator structure from and to the coupler structure.

According to one embodiment of the invention, the optical coupler structure comprises a coupling region between an input/output waveguide connected to the input/output of the gain section and first and second waveguides. The optical coupler thus enables splitting of input light propagating in the input/output waveguide from the gain section into first and second light portions of substantially equal power and direct these light portions to propagate along two spatially separated paths in the first and second waveguides, respectively, and enables combining of light coming from these two paths to propagate through the input/output waveguide to the gain section.

According to one possible implementation of this embodiment, the light reflector structure may be formed by the resonator structure accommodated between the first and second waveguides and optically coupled thereto by first and second spaced-apart coupling regions, respectively. The first and second split light portions thus enter the resonator structure in opposite directions, respectively. Each of the first and second coupling regions are spaced from the coupling region of the optical coupler substantially the same distance, thereby enabling combining of first and second light portions propagating through the resonator structure upon reaching said coupling region.

The resonator structure may comprise the single closed-loop resonator, or any number of closed-loop resonators accommodated in a cascade-like fashion between the first and second waveguides.

The resonator structure may comprise first and second resonator units optically coupled to each other via a light combining waveguide structure. The latter is configured and oriented with respect to the resonator units so as to allow light passage from one of these resonator units into the other, such that the light coupled from one resonator unit into the other propagates in the other resonator unit in the same direction as it propagated in the first resonator unit.

The light combining waveguide structure may comprise an open-end waveguide having first and second substantially linear sections within coupling regions associated with the first and second resonator units, respectively, and a curved section. Alternatively, the light combining waveguide structure may comprise a resonator structure including at least one closed-loop resonator. Each of the resonator units may comprise the single closed-loop resonator, or at least two closed-loop resonators arranged in a cascaded fashion between the respective one of the first and second waveguides and the combining waveguide structure.

According to another possible implementation of this embodiment, the first and second waveguides are first and second closed-loop resonators of first and second resonator units of the resonator structure. The first and second closed-loop resonators thus share a common coupling region with the input/output waveguide.

The reflector structure may be formed by the resonator structure and a light combining waveguide structure arranged so as to define first and second coupling regions to, respectively, the first and second resonator units. The first and second coupling regions may be associated with the first and second closed-loop resonators, respectively. Alternatively, each of the first and second resonator units comprises at least two closed-loop resonators arranged in a cascade-like fashion between the common coupling region and the respective one of said first and second coupling regions. The light combining waveguide structure may comprise an open-end waveguide having substantially linear first and second sections along the first and second coupling regions, and a curved section, or may comprise a resonator structure including at least one closed-loop resonator.

According to another embodiment of the invention, at least one closed-loop resonator of the resonator structure is accommodated between and optically coupled to an input/output waveguide connected to the input/output of the gain section and an additional waveguide. In this case, the optical coupler structure is formed by a coupling region between the resonator structure and the input/output waveguide. The reflector structure is formed by the resonator structure and a reflective surface in a path of light propagating through the additional waveguide.

According to another broad aspect of the present invention, there is provided a laser cavity comprising a gain section and a bi-directional wavelength selective filter device which is optically coupled to input/output of the gain section via an input/output waveguide for filtering light coming from the gain section via said input/output waveguide and returning filtered light into the gain section via said input/output waveguide, wherein said filter device comprises: a resonator structure including at least one closed-loop resonator; and defines an optical coupler structure for coupling light from the input/output waveguide to propagate through said resonator structure, and a light reflector structure for reflecting light filtered by said resonator structure to propagate through said resonator structure to said input/output waveguide, the filter device being configured so as to define two optical paths of substantially the same lengths for light propagation in the resonator structure from and to the coupler structure.

The gain section is preferably formed with an optimized coating on its one external facet and an anti-reflection coating on its another external facet to which the input/output waveguide of the selective filter device is coupled.

According to yet another broad aspect of the present invention, there is provided a method for processing a light output of a gain section in a laser device, the method comprising:

(i) coupling the light output to a wavelength selective filter structure comprising at least one closed-loop resonator, so as to select, from said gain section output, light of a predetermined wavelength band corresponding to the resonance condition of said filter structure;

(ii) directing said selected light to pass through said filter structure in opposite directions so as to return back into said gain section.

More specifically, the filter device of the present invention is useful for processing output light of a gain section, and is therefore described below with respect to this specific application. The filter section can, for example, be composed of a semiconductor based structure utilizing Silicon based or other semiconductor material (InP, InGaAsP, GaAs, InGaAs, AlGaAs, InAlGaAs), which can be used in optoelectronics.

BRIEF DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF THE INVENTION

Figure 1:
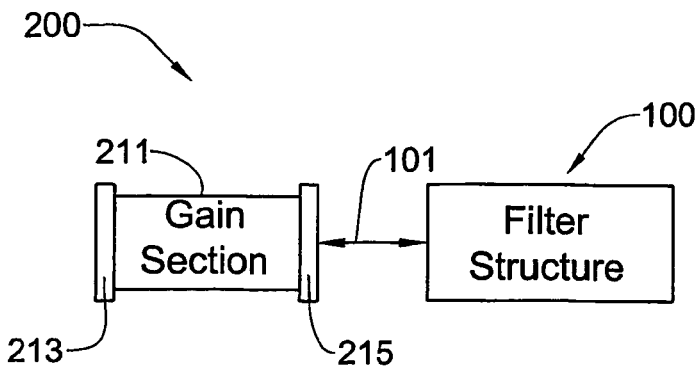
FIG. 1 is a schematic block diagram of a laser cavity according to the present invention formed by a gain section and a bi-directional wavelength selective filter structure.

The principles and operation of the bi-directional wavelength selective filter structure according to the present invention and a laser device utilizing the same may be better understood with reference to the drawings and the accompanying description, it being understood that these drawings and examples in the description are given for illustrative purposes only and are not meant to be limiting. The same reference numerals will be utilized for identifying those components, which are common in all the examples shown in the drawings throughout the present description of the invention. It should be noted that the blocks in the drawings are intended as functional entities only, such that the functional relationships between the entities are shown, rather than any physical connections and/or physical relationships.

Referring to FIG. 1, there is illustrated, by way of a block diagram, a tunable external cavity laser device 200 according to the invention. The laser device 200 includes a laser cavity that is formed by a gain section 211 and a bi-directional wavelength selective filter structure 100 coupled to the gain section via an input/output waveguide 101. The laser cavity is typically associated with a pumping means (which are not specifically shown) that may be of any known suitable type, such as electrical pumping as for diode lasers, optical pumping for solid state or diode lasers.

The construction and operation of the gain section 211 do not form part of the invention, and therefore need not be specifically described, except to note the following. The gain section 211 is preferably associated with an optimized coating 213 placed on the external facet of the gain section, and an anti-reflection coating 215 on another external facet of the gain section to which the input/output waveguide 101 is coupled. The gain section 211 is constituted of a gain medium that can, for example, be a semiconductor based structure utilizing an active semiconductor material, e.g., a composition selected from the following: InP, InGaAsP, GaAs, InGaAs, AlGaAs, InAlGaAs. The optimized coating 213 is arranged for providing a feedback into the gain section 211. Some specific but non-limiting examples of such an optimized coating include a quarter-wave coating or a multi-layer coating. The anti-reflection coating 215 permits low loss coupling and low back reflections of the light emanated from the gain section into the input/output waveguide 101 and may utilize a quarter-wave coating, or multi-layer coating. In addition to the anti-reflection coating, to achieve the required reflection reduction, the waveguide 101 coupled to the gain section may be oriented at an angle with respect to the facet of the gain section, which would result in back reflections not being coupled back into the waveguide 101.

The filter structure 100 is associated with a tuning means TM operable to affect the resonator frequency band of the filter structure. Such a tuning means may utilize one of the following mechanisms: mechanical, electro optic, thermo optic, free carriers injection, or piezoelectric. Output of the gain section 211 collected in the waveguide 101 enters the filter structure 100, and filtered selected frequency band output from the filter structure is collected back at the same waveguide 101 to be returned to the gain section 211.

The wavelength selective filter structure according to the present invention, suitable to be used in a laser device, is a light propagating structure, including one or more ring-like resonators and waveguides coupled thereto, enabling bi-directional propagation of light in the filter structure so as to enable all the filtered light output from the filter structure to input the gain section of the laser device.

FIGS. 2 to 6 illustrate various examples of the filter structure according to the invention.

Figure 2:
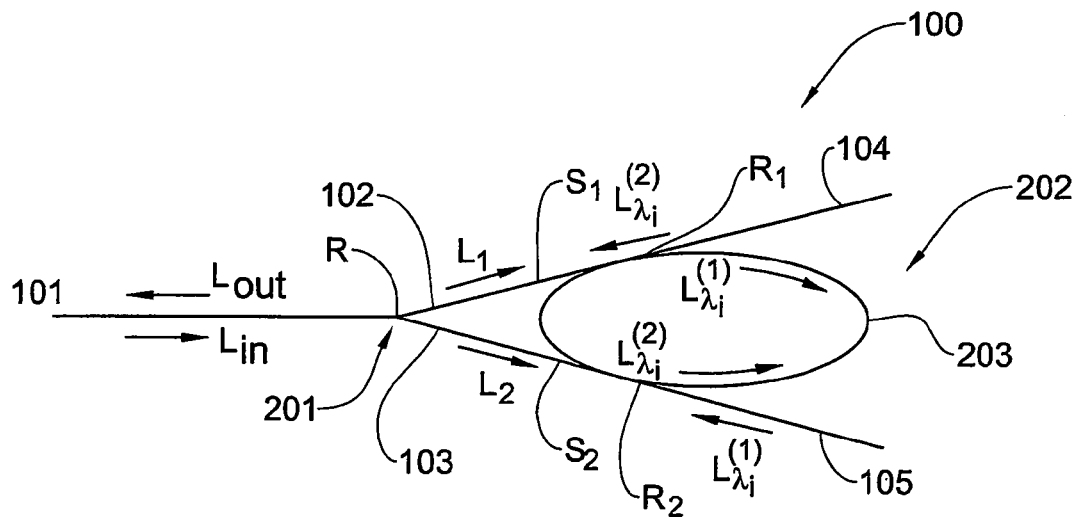
FIG. 2 illustrates a bi-directional wavelength selective filter structure according to one embodiment of the invention, where the filter structure utilizes the single ring-like resonator.

FIG. 2 illustrates a wavelength selective filter structure 100 including an optical coupler 201, and a reflector structure 202. In the present example, the optical coupler 201 is implemented as a Y-coupler formed by a coupling region R between the input/output waveguide 101 and two waveguides 102 and 103. It should, however, be noted that such a Y-coupler actually constitutes any suitable coupler providing an equal power splitting/combining of light between the two waveguides (3 dB coupler).

The coupler 201 is an optical splitter/combiner adapted for splitting input light $L_{in}$, coming from the gain section via the input/output waveguide 101, into two light portions $L_1$ and $L_2$ of substantially the same power, and directing these light portions towards coupling regions $R_1$ and $R_2$ associated with waveguides 102 and 103, respectively, and is adapted for combining two light components $L^{(1)}_{\lambda,i}$ and $L^{(2)}_{\lambda,i}$ coming from the waveguides 102 and 103, respectively, into an output light beam $L_{out}$ to propagate through the waveguide 101 to the gain section.

The reflector structure 202 is formed by a singe closed-loop resonator (ring) 203 accommodated between the waveguides 102 and 103 so as to be optically coupled to the waveguides 102 and 103 at two spaced-apart coupling regions $R_1$ and $R_2$ that are spaced from the coupling region R by segments $S_1$ and $S_2$ of the waveguides 102 and 103, respectively. The arrangement is such that the ring resonator 203 and segments $S_1$ and $S_2$ of the waveguides 102 and 103 between coupling regions $R_1$ and $R_2$ and coupling region R define equal optical path lengths for light components $L^{(1)}_{\lambda,i}$ and $L^{(2)}_{\lambda,i}$.

The device 100 operates in the following manner. Input light $L_{in}$ propagated in the input waveguide 101 reaches the coupler 201 (region R), and is split equally between the waveguides 102 and 103. At the coupling region $R_1$, a wavelength component $L^{(1)}_{\lambda,i}$ of the light portion $L_1$ having the frequency band coinciding with the resonant band of the ring resonator 203 is coupled into the ring resonator 203 for clockwise propagation around the ring, while all other wavelength components of the light portion $L_1$ continue propagation into a segment 104 of the waveguide 102. At the coupling region $R_2$, a wavelength component $L^{(2)}_{\lambda,i}$ of the light portion $L_2$ having the frequency band coinciding with the resonant band of the ring resonator 203 is coupled into the ring resonator for counterclockwise propagation around the ring, while all other wavelength components of the light portion $L_2$ continue propagation into a segment 105 of the waveguide 103. Upon circulation in the ring resonator, the wavelength components $L^{(1)}_{\lambda,i}$ and $L^{(2)}_{\lambda,i}$ are coupled from the ring resonator 203 into the waveguides 103 and 102 at the coupling regions $R_2$ and $R_1$, respectively, and propagate through the segment $S_2$ and $S_1$ of these waveguides to the optical coupler (splitter/combiner) 201 to pass through the waveguide 101 towards the gain section of the laser cavity.

It should be appreciated by a person versed in the art that with the stationary mounted bi-directional wavelength selective filter structure 100 and equal waveguide segments $S_1$ and $S_2$, the optical path lengths for the light components propagating in the resonator structure in the opposite directions are equal. Therefore, both light components $L^{(1)}_{\lambda i}$ and $L^{(2)}_{\lambda i}$ arrive at the coupler 201 (region R) with the same optical phase, which results in a coherent buildup of the output light $L_{out}$ back at the waveguide 101. Therefore, the filter structure 100 can effectively suppress transmission peaks at wavelengths other than a selected wavelength (defined by the resonance condition of the resonator). It should be understood that if the light components $L^{(1)}_{\lambda i}$ and $L^{(2)}_{\lambda i}$ would have been out of phase (e.g., as a result of movement of the resonator ring), then a light portions from one of the waveguides 102 and 103 arriving at the coupler 201 would not be combined with the other light component to propagate into the waveguide 101 but would be directed back into the respective one of these waveguides.

Figure 3A:
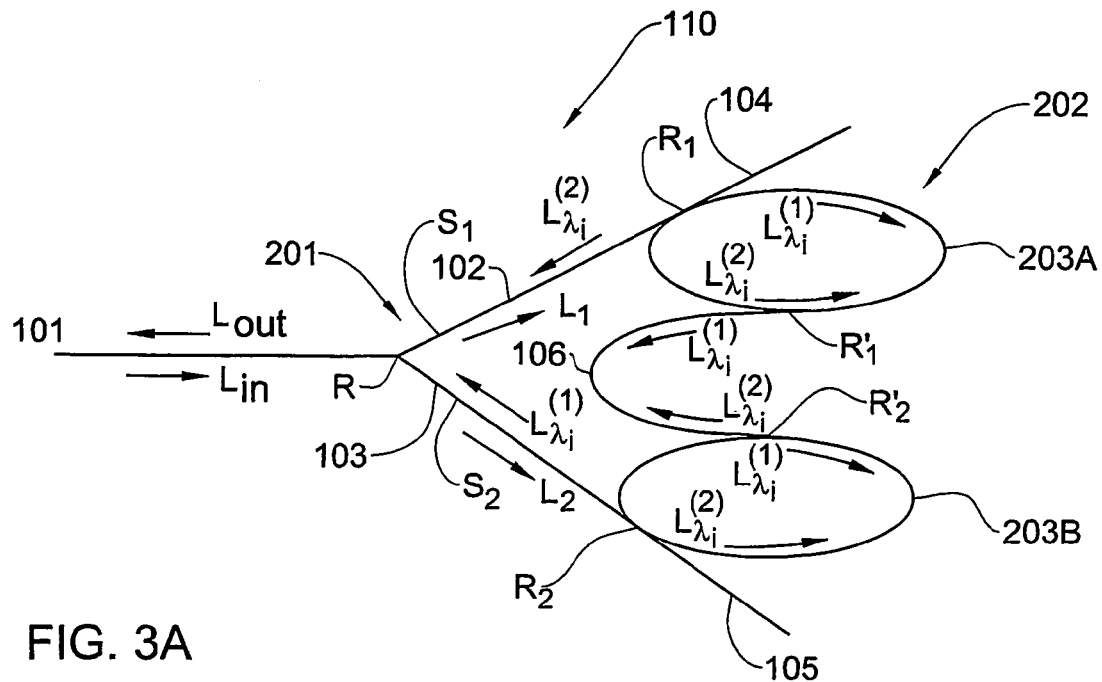
FIGS. 3A and 3B illustrate two examples of a bi-directional wavelength selective filter structure according to another embodiment of the invention, where the filter structure utilizes two resonator units coupled to each other by a curved waveguide.

FIG. 3A illustrates a bi-directional wavelength selective filter structure 110 including a multiple-ring resonator. The structure 110 includes an optical coupler 201 formed a coupling region R between the input/output waveguide 101 and waveguides 102 and 103 (Y-coupler), and a resonator-based reflector structure 202. In the present example, the reflector structure 202 is composed of two resonator units 203A and 203B centered to the same selected wavelength band, which are optically coupled to the waveguides 102 and 103 via coupling regions $R_1$ and $R_2$, respectively, and are optically coupled to each other via an additional waveguide 106 at coupling regions $R'_1$ and $R'_2$. The waveguide 106 presents a light combining waveguide structure that leads the light from the first resonator unit into the second one and vice versa. This combining waveguide 106 is oriented with respect to the light propagation scheme such that light coupled from the first resonator unit 203A into the second resonator unit 203B, propagates in the second resonator unit in the same direction as it propagated in the first resonator unit. As shown, the waveguide 106 is configured so as to define substantially linear segments thereof within coupling $R'_1$ and $R'_2$ regions, and a curved region. Similarly to the previous example, the ring resonators 203A and 203B are accommodated such that segments $S_1$ and $S_2$ of the waveguides 102 and 103 between coupling regions $R_1$ and $R_2$ and coupling region R define equal optical path lengths.

The device 110 operates in the following manner. Input light L propagated in the waveguide 101 reaches the coupler 201 (region R), and is split into equal light portions $L_1$ and $L_2$ directed into the waveguides 102 and 103. A light component $L^{(1)}_{\lambda i}$ of the light portion $L_1$ having the frequency band coinciding with the resonant band of the ring resonator 203A is coupled into the ring resonator 203A for clockwise propagation around the ring, while all other wavelength components of the light portion $L_1$ propagate to the waveguide segment 104 of the waveguide 102. This light component $L^{(1)}_{\lambda i}$ is then subsequently coupled from the resonator ring 203A into the waveguide 106, from the waveguide 106 into the second resonator ring 203B for clockwise propagation around the ring 203B, and into the waveguide segment $S_2$ through which the twice-filtered thereby light component is directed back to the coupler 201. The two-ring structure thus carries out a double-stage filtering of the selected frequency band. The similar light propagation occurs in the opposite direction: A light component $L^{(2)}_{\lambda i}$ of the light portion $L_2$ having the frequencies coinciding with the resonant frequencies of the ring 203B is coupled into the ring resonator 203B for counterclockwise propagation around the ring 203, and is then subsequently coupled into the waveguide 106, ring 203A, and waveguide segment $S_1$ to return to the coupler 201. Therefore, both light components $L^{(1)}_{\lambda i}$ and $L^{(2)}_{\lambda i}$ arrive at the coupler 201 with equal optical phase, which results at a coherent buildup of the light $L_{out}$ back at the input waveguide 101.

Figure 3B:
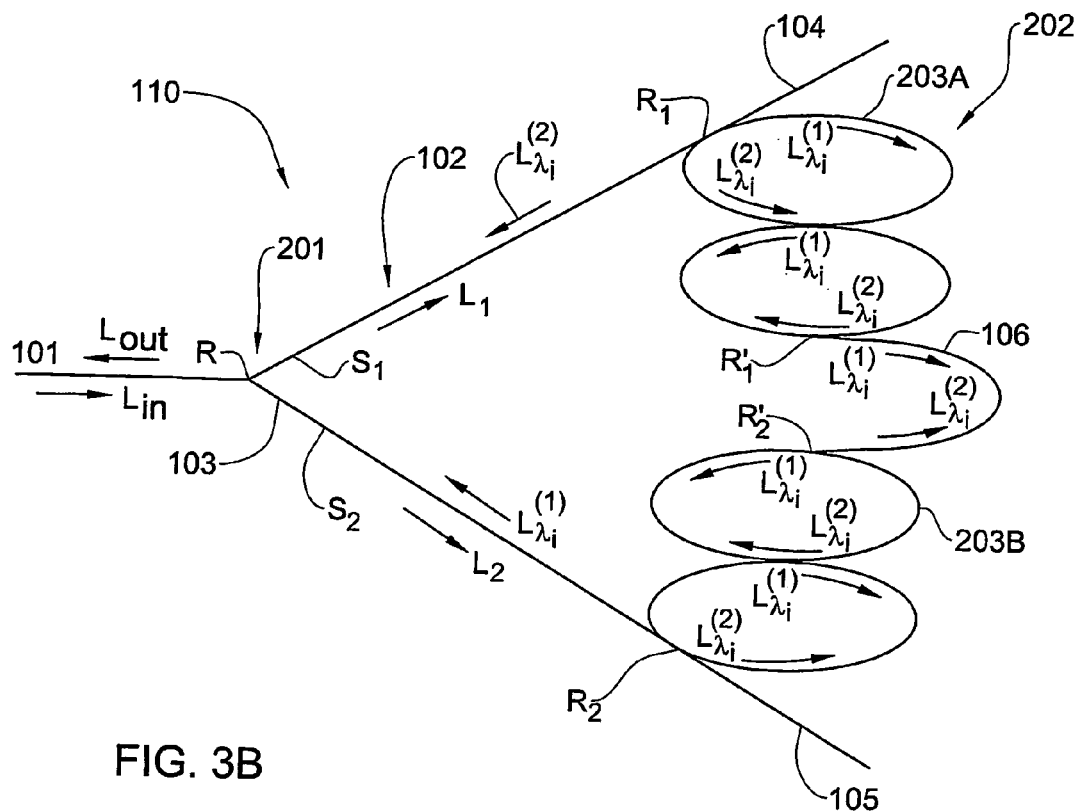

In the example of FIG. 3A, each of the resonator units 203A and 203B includes a single closed-loop resonator (ring). FIG. 3B exemplifies a multiple-resonator based reflector structure designed similar to that of FIG. 3A, but having each resonator unit formed of a pair of ring-like resonators arranged in a cascaded fashion between the respective one of the waveguides 102 and 103 and the combining waveguide structure 106. Accordingly, the combining waveguides 106 in the examples of FIGS. 3A and 3B are oriented identically symmetrical. It should be understood that, generally, each of the resonator units may include one or more ring resonators and the orientation of the waveguide 106 depends on the number of rings in the resonator unit, to thereby ensure the desired light propagation directions in the resonator structure as described above. For example, for three-ring cascade, the waveguide 106 would be arranged similar to that of FIG. 3A.

Figure 4:
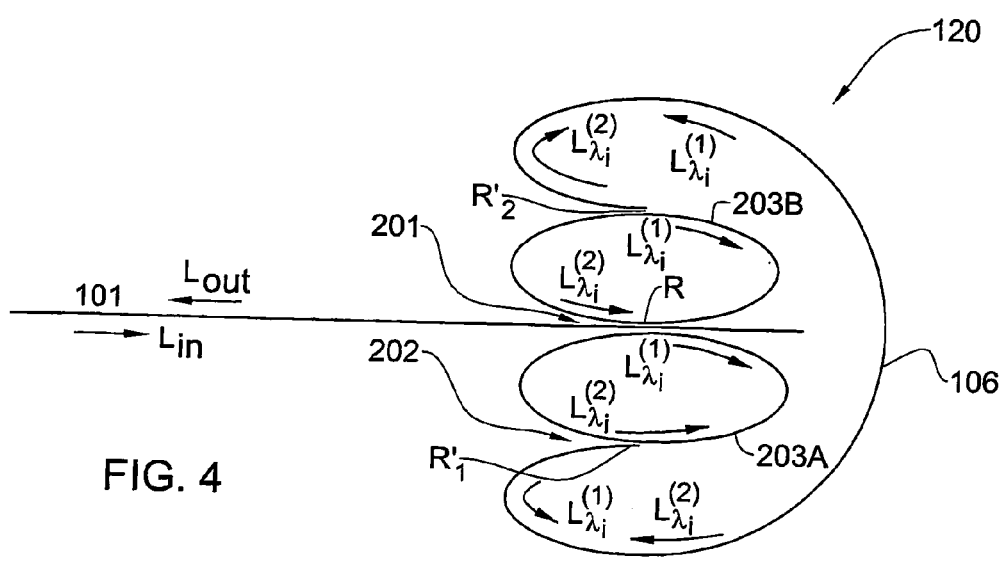
FIG. 4 illustrates a bi-directional wavelength selective filter structure according to yet another embodiment of the invention, where the filter structure utilizes two ring-like resonators sharing a common waveguide section and coupled to each other by an additional curved waveguide.

FIG. 4 illustrates a bi-directional wavelength selective filter structure 120 including an optical coupler 201 formed by a common coupling region R between the input/output waveguide 101 and two close-loop resonator units 203A and 203B; and a resonator-based reflector structure 202 formed by these resonator units 203A and 203B and a curved waveguide 106 (light combining waveguide structure) coupled to the resonator units via coupling regions $R'_1$ and $R'_2$, respectively. Thus, in this example, in distinction to the previously described examples, the splitting of the input light and combining of filtered light is obtained by using two resonator units sharing a common waveguide section (coupling region) R. Similarly to the examples of FIGS. 3A and 3B, each of the resonator units may include more than one ring-like resonator, and the orientation of the curved region of the waveguide structure 106 with respect to the resonators depends on the number of resonators in each resonator unit.

The device 120 operates as follows. Input light $L_{in}$ in the waveguide 101 reaches the coupler 201 (region R), and is split into equal light components $L^{(1)}_{\lambda i}$ and $L^{(2)}_{\lambda i}$, each having the frequency band coinciding with the resonant band of the ring resonator, directed into the rings 203A and 203B for counterclockwise and clockwise propagation therein, respectively. These light components $L^{(1)}_{\lambda i}$ and $L^{(2)}_{\lambda i}$ are then coupled to the waveguide 106 at the coupling regions $R'_1$ and $R'_2$, respectively. Hence, light component $L^{(1)}_{\lambda i}$ propagates in the waveguide 106 from region $R'_1$ to region $R'_2$, where it is coupled into ring 203B. Light component $L^{(2)}_{\lambda 1}$ propagates in the waveguide 106 from region $R'_2$ to region $R'_1$ where it is coupled into ring 203A. The two light components $L^{(1)}_{\lambda i}$ and $L^{(2)}_{\lambda i}$ thus reach the coupler 201 (region R) with equal optical phase, and are combined into output light $L_{out}$ that returns back to the input waveguide 101.

Figure 5:
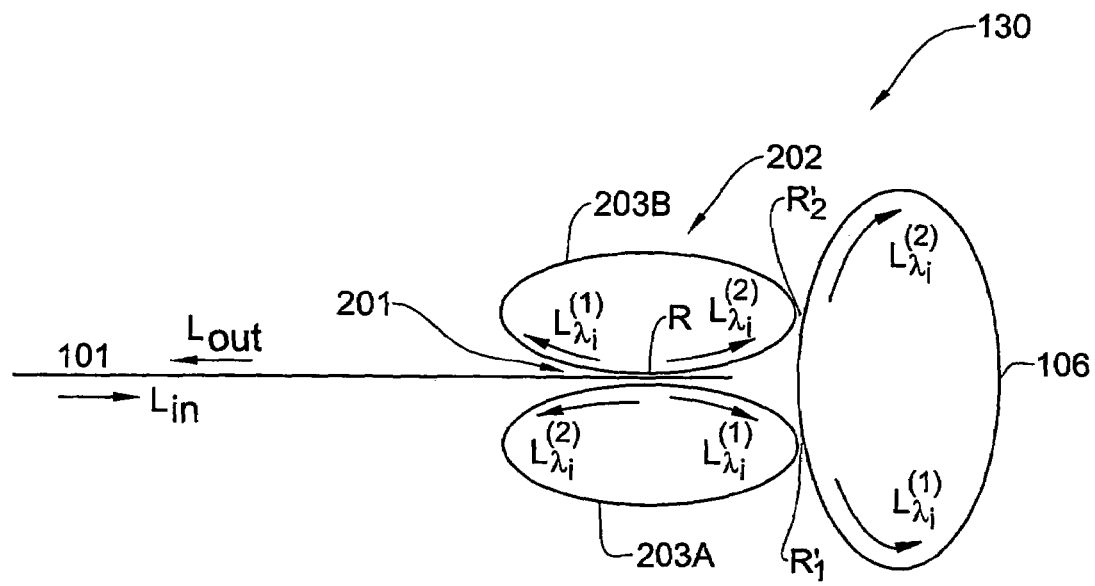
FIG. 5 illustrates a bi-directional wavelength selective filter structure according to yet another embodiment of the invention, where the filter structure utilizes two ring-like resonators sharing a common waveguide section and coupled to each other by an additional resonator.

FIG. 5 illustrates a bi-directional wavelength selective filter structure 130 where, similar to the example of FIG. 4, the splitting/combining of input/output light is obtained by using two resonator units sharing a common waveguide section, but in distinction to the example of FIG. 4, the combining open-end waveguide is replaced by an additional resonator unit (closed-loop waveguide).

The device 130 thus includes an optical coupler 201 formed by a coupling region R between the input/output waveguide 101 and two closed-loop resonator units 203A and 203B; and a resonator-based reflector structure 202 formed by these resonator units 203A and 203B and an additional resonator unit 106 (constituting a light combining waveguide structure) coupled to the resonator units via coupling regions R'$_1$ and R'$_2$, respectively. Input light L$_{in}$ in the waveguide 101 reaches the coupler 201 (region R), and is split into equal light components L$^{(1)}_{\lambda,i}$ and L$^{(2)}_{\lambda,i}$, each having the frequency band coinciding with the resonant band of the respective ring resonator, that are coupled into the rings 203A and 203B for clockwise and counterclockwise propagation therein, respectively. Light components L$^{(1)}_{\lambda,i}$ and L$^{(2)}_{\lambda,i}$, upon reaching the coupling regions R'$_1$ and R'$_2$, respectively, are coupled to the resonator unit 106, where they propagate in the opposite directions such that these light components L$^{(1)}_{\lambda,i}$ and L$^{(2)}_{\lambda,i}$ are further coupled from the ring 106 to rings 203B and 203A, respectively, to be combined at region R into output light L$_{out}$ returning back into waveguide 101.

Although the examples of FIGS. 4 and 5 show single-ring resonator units 203A and 203B, as well as a light waveguide combining structure formed of the single-resonator unit 203 in FIG. 5, it should be understood that the same can be implemented by using multiple-resonator units with an appropriate number of resonators to ensure the desired light propagation directions in the resonator structure, namely that light, coupled from resonator unit 203A to resonator unit 203B propagates in resonator unit 203B in the same direction as that of its original propagation in unit 203A.

In the previously described examples, coupling of light between the gain section and the filter structure was implemented by splitting the light into two light portions, and filtering these light portions and reflecting the filtered light back to the input/output waveguide while propagating the split light portions via two symmetrical paths defined by resonator-based reflector. The following is an example where the light coupling does not utilize splitting the input light into spatially separated symmetrical paths, but utilizes the filtering of the input light with a resonator-based structure and propagating of the filtered light towards and away from a light reflector, and filtering again.

Figure 6:
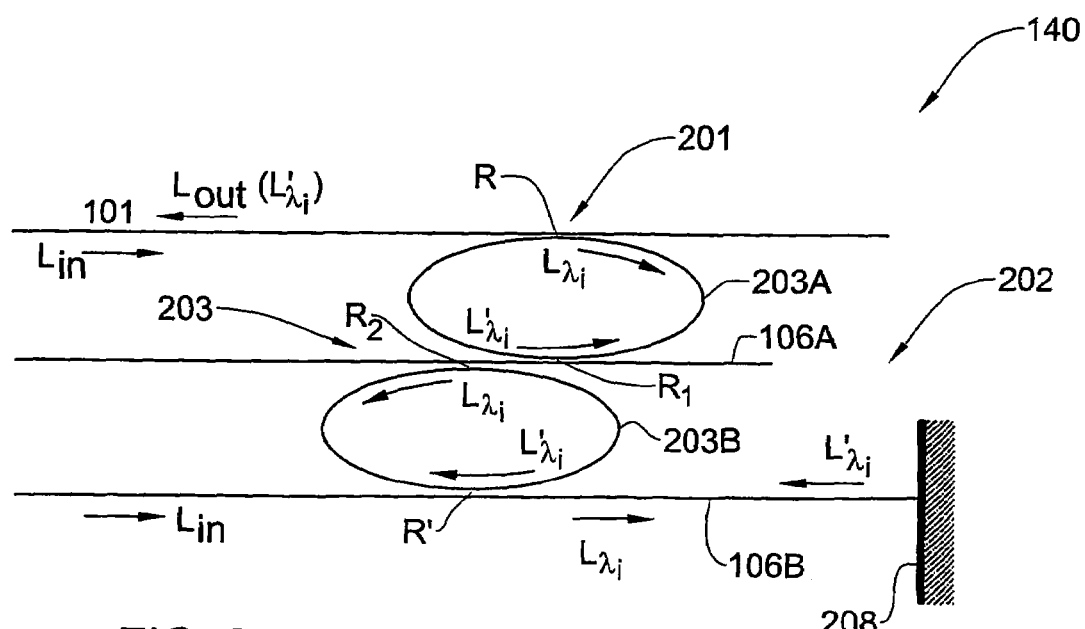
FIG. 6 illustrates a bi-directional wavelength selective filter structure according to yet another embodiment of the invention, where the filter structure utilizes a multiple ring resonator structure and a reflection element.

FIG. 6 a bi-directional wavelength selective filter structure 140 including an optical coupler 201 formed by a coupling region R between the input/output waveguide 101 and a resonator structure 203; and a reflector structure 202 formed by this resonator structure 203 and a reflector element 208 coupled to the resonator structure. The resonator structure is generally a structure formed by at least one ring-like resonator accommodated between and optically coupled to two waveguides. In this specific but non-limiting example of FIG. 6, the resonator structure 203 is composed of two rings 203A and 203B coupled to each other by an intermediate waveguide 106A via coupling regions R$_1$ and R$_2$, coupled to the input/output waveguide 101 via coupling region R between the waveguide 101 and ring 203A, and coupled to the reflector element 208 by a waveguide 106B extending between the reflector 208 and a coupling region R' between the ring 203B and waveguide 106B. It should be understood that the same can be implemented by using a single-stage resonator (with no intermediate waveguide 106A), namely single ring between waveguides 101 and 106B or a compound resonator formed by at least two spaced-apart rings between waveguides 101 and 106B as disclosed in WO 01/27692 assigned to the assignee of the present application; as well as a multi-stage resonator formed by two or more rings arranged in a cascaded fashion between waveguides 101 and 106A and/or between waveguides 101 and 106B, provided the reflector element 208 is appropriately coupled to waveguide 106A (or waveguide 106B) depending on the design of the resonator structure and the number of rings therein.

As shown in FIG. 6, input light L$_{in}$ propagates through the waveguide 101 and upon reaching the coupler 201 (region R), undergoes wavelength selective filtering such that a light components L$_{\lambda,i}$ having the frequency band coinciding with the resonant band of the resonator structure 203, is coupled to this structure and directed into the ring 203A for clockwise propagation therein, while all the other wavelength components of input light continue propagation through the waveguide 101. The filtered light component L$_{\lambda,i}$ is then coupled from ring 203A to ring 203B via waveguide 106A, and then coupled from ring 203B to waveguide 106B to propagate to the reflector 208. The reflected part of this light component L'$_{\lambda,i}$ returns back through waveguide 106B, is coupled to ring 203B and then to ring 203A, and returns to the waveguide 101 in the direction opposite to that of the input light.

Tuning of the bi-directional wavelength selective filter structure to a selected wavelength can be achieved in a conventional manner by changing the resonant properties of the filter structure. For example, mechanical, electro optic, thermo optic, free carriers injection, or piezoelectric effects can be used to cause changes in the size or refractive index of the waveguides (linear and/or ring waveguides) forming the filter structure.

The use of two or more resonator units in the tunable filter structure provides for enhanced filter characteristics (rejection ratio), extended free spectral range (FSR) and tuning range by using the Vernier effect, where each resonator has a different free spectral range and lasing occurs only at the frequency where all resonators meet. Due to the different free spectral ranges of the resonators, the combined free spectral range of the reflector structure is obtained from their common least common divisor. The combined filter response is obtained by a multiplication of the individual ring resonator frequency responses. Hence only when all resonators are aligned at a given frequency, filter does provide a throughput signal at that frequency.

Those skilled in the art will readily appreciate that various modifications and changes can be applied to the embodiments of the invention as hereinbefore exemplified without departing from its scope defined in and by the appended claims. For example, the optical coupler utilized in the tunable bi-directional wavelength selective filter structure of the invention can be terminated by a taper structure to reduce loss at the interface between the elements. It is apparent that any number of resonator rings can be concatenated in the resonator structure to result in an even more enhanced filtering characteristics and extended FSR and tuning range.

The invention claimed is:

1. A wavelength selective filter device comprising:
  a light reflector structure comprising first and second resonator units; and
  an optical coupler structure coupling light from an input/output of a laser structure to propagate through said light reflector structure,
  said light reflector structure being operative to reflect light filtered by said first and second resonator units so as to propagate to said input/output of the laser structure, said light reflector structure being configured so as to define two optical paths of substantially the same lengths for light propagation in said first and second resonator units from and to the coupler structure, and wherein said optical coupler structure comprises:

first and second waveguides; and a coupling region between an input/output waveguide connected to said input/output of the laser structure and said first and second waveguides, said optical coupler structure being operative to:

split input light propagating in said input/output waveguide from the laser structure into first and second light portions of substantially equal power;

direct said two light portions to propagate along two spatially separated paths in said first and second waveguides, respectively; and combine light coming from said two paths to propagate through said input/output waveguide to the laser structure.

2. The device of claim 1, wherein said light reflector structure is formed by said first and second resonator units accommodated between said first and second waveguides and optically coupled thereto by first and second spaced-apart coupling regions, respectively, said first and second split light portions thereby entering the light reflector structure in opposite directions, respectively, each of said first and second coupling regions being spaced from said coupling region of the optical coupler substantially the same distance.

3. The device of claim 2, wherein at least one of said first and second resonator units comprises a single closed-loop resonator.

4. The device of claim 2, wherein said first and second resonator units accommodated between said first and second waveguides are accommodated in a cascade-like fashion between said first and second waveguides.

5. The device of claim 2, further comprising a light combining waveguide structure configured and oriented with respect to said first and second resonator units so as to allow light passage from said first resonator unit into said second resonator unit, said first and second resonator units accommodated between said first and second waveguides being optically coupled to each other via said light combining waveguide structure, such that the light coupled from said first resonator unit into said second resonator unit propagates in said second resonator unit in the same direction as it propagated in said first resonator unit.

6. The device of claim 5, wherein said light combining waveguide structure comprises an open-end waveguide having first and second substantially linear sections within coupling regions associated with said first and second resonator units, respectively, and a curved section.

7. The device of claim 5, wherein said light combining waveguide structure comprises at least one closed-loop resonator.

8. The device of claim 5, wherein each of said first and second resonator units comprises at least two closed-loop resonators arranged in a cascaded fashion between the respective one of said first and second waveguides and said light combining waveguide structure.

9. The device of claim 1, wherein said first and second waveguides are constituted at least partially by said first and second resonator units, said first and second resonator units sharing a common coupling region with the input/output waveguide.

10. The device of claim 9, wherein said light reflector structure further comprises a light combining waveguide structure arranged so as to define first and second coupling regions to, respectively, said first and resonator units.

11. The device of claim 10, wherein each of said first and second resonator units comprises at least two closed-loop resonators arranged in a cascade-like fashion between said common coupling region and the respective one of said first and second coupling regions.

12. The device of claim 10, wherein said light combining waveguide structure comprises an open-end waveguide having substantially linear first and second sections along said first and second coupling regions, respectively, and a curved section.

13. The device of claim 10, wherein said light combining waveguide structure comprises at least one closed-loop resonator.

14. The device of claim 1, wherein said light reflector structure further comprises:

an additional waveguide; and a reflective surface said first resonator unit comprising a closed-loop resonator optically coupled to an input/output waveguide connected to said input/output of the laser structure, said first resonator unit being optically coupled to said additional waveguide, said second resonator unit being optical coupled to said additional waveguide, said reflective surface being accommodated in a path of light propagating through said additional waveguide.

15. A method for processing light output of a gain section in a laser device, the method comprising:

(i) coupling the light output of a gain section to a wavelength selective filter structure comprising at least two closed-loop resonators, so as to select from said light output light of a predetermined wavelength band corresponding to the resonance condition of said filter structure; and (ii) directing said selected light of the predetermined wavelength band to pass through said filter structure in opposite directions along two optical paths of substantially the same lengths so as to return back into said gain section, wherein said coupling is carried out by providing a coupling region between an input/output waveguide associated with input/output of the gain section and said filter structure, and wherein said directing comprises:

splitting the light output at said coupling region into first and second light portions of substantially equal power;

directing them along first and second spatially separated paths to be coupled to first and second resonator units, respectively;

passing first and second light portions coupled to said first and second resonator units, respectively, to said coupling region along, respectively, two optical paths of substantially the same length; and combining said passed first and second light portions into an output light beam to propagate through the input/output waveguide to the gain section.

* * * * *